United States Patent [19]
Doi et al.

[11] Patent Number: 5,844,468
[45] Date of Patent: Dec. 1, 1998

[54] CHIP NETWORK ELECTRONIC COMPONENT

[75] Inventors: Masato Doi, Kyoto; Yoshinori Matsumoto, Osaka, both of Japan

[73] Assignee: Rohm Co. Ltd., Kyoto, Japan

[21] Appl. No.: 855,813

[22] Filed: May 12, 1997

[30] Foreign Application Priority Data

May 13, 1996 [JP] Japan .................................. 8-117434
May 13, 1996 [JP] Japan .................................. 8-117435

[51] Int. Cl.⁶ ...................................................... H01C 1/02
[52] U.S. Cl. ............................................. 338/260; 338/320
[58] Field of Search ................................. 338/313, 293, 338/325, 320, 260, 262, 318, 327, 309

[56] References Cited

U.S. PATENT DOCUMENTS 5,334,968  8/1994  Negoro ..................................... 338/320

Primary Examiner—Teresa J. Walberg
Assistant Examiner—Jeffrey C. Pwu
Attorney, Agent, or Firm—Nikaido Marmelstein Murray & Oram LLP

[57] ABSTRACT

Disclosed is a chip network electronic component prevents a short circuit between adjacent electrodes upon soldering, and the strength of the projecting portion is increased to improve reliability. The chip network electronic component includes an insulator substrate having recessed portions in opposite side surfaces to have a plurality of pairs of projecting portions. Electrodes are formed respectively at the projecting portions so as to extend from a main surface to a back surface of the substrate. Electrical elements are each formed on the main surface of the substrate to electrically connect between one pair of the electrodes. A coating layer covers a surface of the electrical elements. The recessed portion includes a pair of opposite flat planes and a flat-planed bottom connecting between the flat planes. The flat plane and the bottom has a connecting portion formed therebetween to have a curvature of 0.1 mm or greater.

10 Claims, 8 Drawing Sheets

CHIP NETWORK ELECTRONIC COMPONENT

BACKGROUND OF THE INVENTION

This invention relates to a chip network electronic component which includes resistance elements, capacitance elements, coils or the like in plurality of number, or a chip network electronic component that has a combination of such electronic elements.

Conventionally, there has been known a chip network resistor which has a plurality of resistors as a chip network electronic component of this kind. The conventional art will be explained by exemplifying the chip network resistor based on FIGS. 12 through 15.

In FIG. 12, there is illustrated a complete chip network resistor. As depicted, the chip network resistor has a substrate 21 having a plurality of electrodes 29 projecting from respective side surfaces thereof. That is, recessed portions are formed between electrodes 29, 29 to thereby providing projecting portions 21A between the recessed portions. The recessed portion will be stated in more detail later.

In such network resistors, the spacing P2 between the adjacent electrodes 29, 29 is determined extremely narrow, typically 0.5 mm or less, in order to match the electrode pitch of other electronic components such as ICs mounted together with the network resistor on a circuit pattern of a circuit board. Meanwhile, the thickness of the substrate 21 is extremely thin, which is formed by the utilization of a ceramic substrate in a thickness of for example 0.5 mm, 0.4 mm, or 0.3 mm.

However, where a network resistor with a electrode-to-electrode pitch of 0.5 mm or smaller is soldered onto a circuit pattern of a circuit board of glass-epoxy resin or the like, there is a problem of occurrence of short circuit between adjacent electrodes. For avoiding such a problem, the present applicant has proposed in Japanese provisional Patent Publication (Kokai) No. H5-243020 and U.S. Pat. No. 5,334,968 to alter the shape of the recess between the adjacent electrode from the conventional circular or oval plan form to a rectangular form.

By altering the recess shape to a rectangular plan form 28, provided are a pair of straight-lined flat planes 28A, 28A and a bottom face 28B rectangular to these flat planes 28A, 28A. The provision of the rectangular recesses to the substrate 21 separate the adjacent flat planes 28A, 28A on one projecting portion. In this manner, by forming the recess with a straight bottom 28B and a pair of flat planes 28A, 28A rectangular thereto, it is possible to reduce the possibility of short circuit by solder during mounting onto a printed board. Although the fact of short circuit reduction has been empirically proven, the technical ground thereon is not necessarily revealed.

Referring to FIG. 13, the distance between the electrodes 29, 29 is restricted to 0.5 mm or less because of necessity of conformity with the spacing of a circuit pattern as stated before so that it is difficult to increase to an extent of avoiding a short circuit. Nevertheless, the separation between electrodes 29, 29 by the recess with the straight bottom 28B and the rectangular two flat planes 28A, 28A provides substantial increase in electrode-to-electrode distance with respect to along-surface of the substrate 21. That is, reflow solder propagates from the one flat plane portion 28A through the bottom portion 28B to the adjacent flat plane portion 28A, i.e., in directions shown by the arrow. Thus, the substantial distance of solder propagation is increased between the adjacent electrodes 29, 29. On the contrary, where the shape of the recess is in a conventional semilunar form (see Japanese Provisional Patent Publication (Kokai) No. S61-37994) as shown by the one-dot chain line, there is no existence of parallel flat planes and a bottom portion so that the distance of solder propagation is approximated to the straight-line distance between the electrodes 29, 29. Thus, there is a high possibility of a short circuit occurring.

However, where the recess is structured by the pair of flat planes and the bottom face as stated, the strength of the projecting portion defined between two recesses decreases as compared with that of the projection that is formed between the semilunar recesses as in above Japanese Provisional Patent Publication No. S61-37994. In order to eliminate this problem, it may be considered that the width P1 of the electrode 29 is increased broader. Nevertheless, there is a problem that the electrode width is limited to 1 mm or less, about 0.5 mm in usual cases, practically impossible to increase. However, with such low strength of the projection 21A, there often arise causes during the manufacturing process that the projection 21A is broken to separate away part of electrode 29 from the substrate 21 or microcracks are induced at a corner between the plat plane 28A and the bottom 28B as shown in FIG. 14 that possibly leads to a fracture in the projection 21A. In other words, the manufacturing process involves electroplating with barrels or the like, resistance measurement with a measuring terminal 31 depressed from the above at a pressure of approximately 100 gf as shown in FIG. 15, transportation after manufacture, and so on, wherein the network resistance component experiences force or pressure.

SUMMARY OF THE INVENTION

It is the object of the present invention to provide a chip network electronic component having a plurality of pairs of projecting portions in opposite side surfaces of an insulator substrate to have electrodes provided respectively at the projecting portion, wherein, even if the pitch of the electrodes is determined small, a short circuit between adjacent electrode is prevented upon soldering and the strength of the projecting portion is increased to improve the reliability.

In accordance with a first aspect of the present invention, there is provided a chip network electronic component comprising:

an insulator substrate having recessed portion in opposite side surfaces forming a plurality of pairs of projecting portions;

electrodes formed respectively on each of the pairs of projecting portions so as to extend from a main surface to a back surface of the substrate;

a plurality of electrical elements each formed on the main surface of the substrate and electrically connected between one pair of the electrodes;

a coating layer covering a surf ace of the electrical elements; and wherein each of the recessed portions comprises a pair of opposite flat planes and a flat-planed bottom connecting the pairs of opposite flat planes, the pairs of opposite flat plane and the bottom has a connecting portion formed therebetween with a curvature of 0.1 mm or greater.

With such a structure, the recessed portion between the adjacent projecting portions is formed by the opposite flat planes and flat-planed bottom so that the along-surface distance between the adjacent electrodes is increased to effectively prevent a short circuit even where the electrodeto-electrode distance is relatively small. Furthermore, the corner between the flat plane and the bottom has no small, or rectangular, angle and accordingly almost free from occurrence of cracks or fractures in the recessed portion.

In accordance with a second aspect of the invention, the recessed portion comprises a pair of opposite flat planes and a flat-planed bottom connecting between the flat planes, the flat plane and the bottom having a connecting portion formed therebetween with at least one flat plane. With such a connecting portion, there is almost no concentration of stresses due to external impacts, and the recessed portion is prevented from having cracks or fractures therein.

Where the distance between the opposite flat planes is smaller than for example 0.5 mm, the projecting portion is provided narrow in width, providing special efficiency.

If the projecting portion has a width greater than the distance between the opposite flat planes, the strength of the projecting portion further increases.

If the coating layer is formed so as to extend to the surface of at least part of the projecting portion, or to the surface of at least part of the flat plane and/or the bottom of the recessed portion, the strength of the projecting portion further increases.

BRIEF DESCRIPTION OF THE DRAWINGS

The foregoing and other features and objects of the present invention and the manner of attaining them will become more apparent and the invention itself will be best understood by reference to the following description of a preferred embodiment taking in conjunction with the accompany drawings, wherein.

PREFERRED EMBODIMENTS OF THE INVENTION

Figure 1:
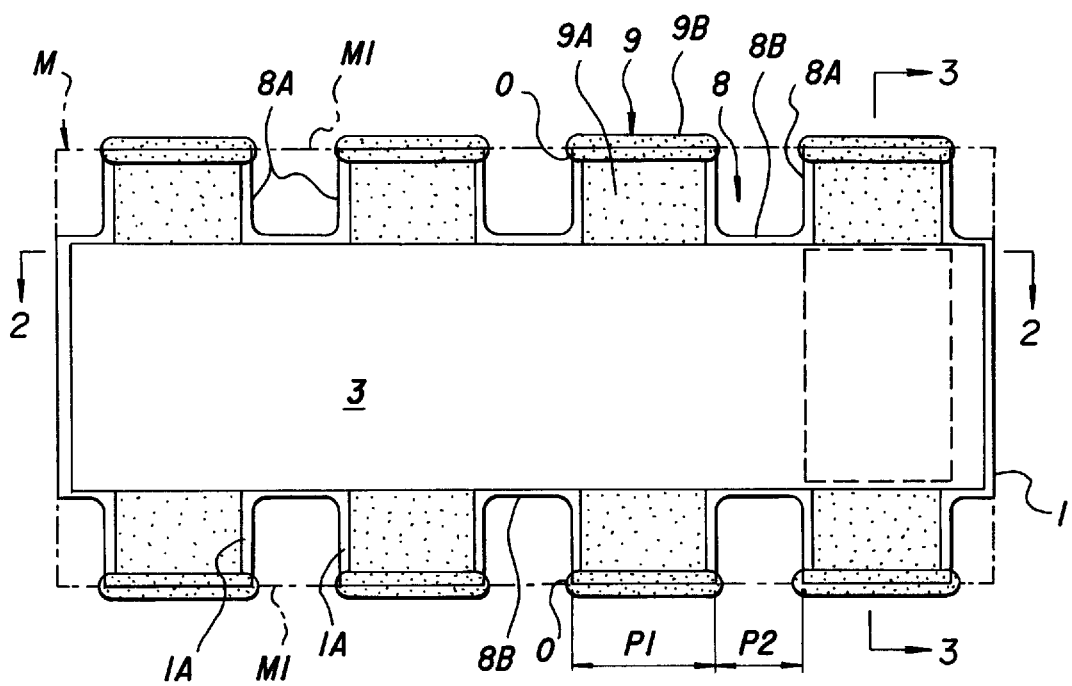
FIG. 1 is a plan view of a chip network resistor according to the present invention.
Figure 2:
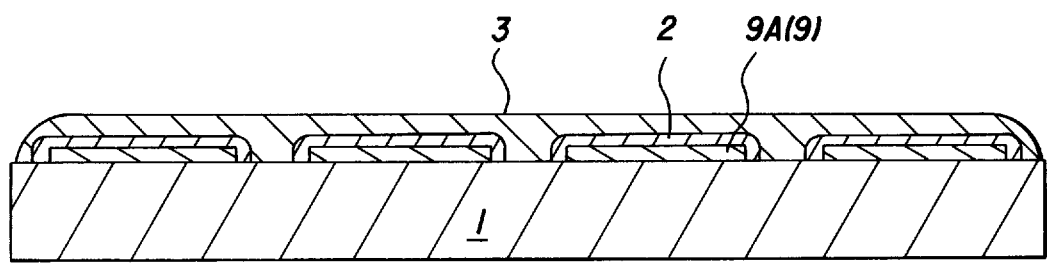
FIG. 2 is a sectional view taken on line A—A in FIG. 1.
Figure 3:
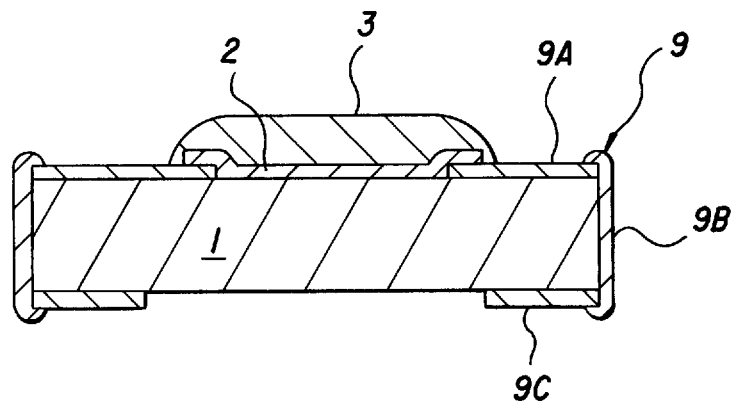
FIG. 3 is a sectional view taken on line B—B in FIG. 1.

There will be explained one embodiment of a chip network electronic component applied to a chip network resistor with reference to FIG. 1 to FIG. 4. FIG. 1 is a plan view of a chip network resistor, while FIG. 2 and FIG. 3 respectively show a sectional view taken on line A—A in FIG. 1 and a sectional view on line B—B.

The chip network electronic component comprises a insulator substrate 1 having a plurality of recessed portions 8 formed on opposite side surfaces thereof in a paired manner, thereby providing projecting portions 1A. Electrodes 9 are formed at the respective surfaces of the projecting portions 1A, each of which includes a surface electrode 9A, a side electrode 9B and a back electrode 9C. A plurality of electric elements 2 are formed on the surface of the substrate 1 to be electrically connected between an associated pair of surface electrodes 9A, 9A. A coating layer 3 is formed to cover the surface of the electric elements 2. The recessed portion 8 has a pair of opposite flat-plane portions 8A, 8A, and a flat-plane bottom portion 8B formed between these flat planes 8A, 8A in a manner continuous therewith. Between the flat-plane portion 8A and the bottom portion 8B are formed an arcuate-planed connecting portion, i.e. a corner, that has a curvature of 0.1 mm or greater.

The electric element 2, where it comprises for example a resistance element, is formed by printing and burning a resistive material such as ruthenium oxide. The resistance elements formed are subjected to laser trimming for being adjusted for resistance value. Otherwise, the resistance element may be provided by depositing a resistive element to have a predetermined resistance value. The electric element may alternatively comprise, instead of the resistance element, a capacitance element, a coil, or a combination of such elements. Meanwhile, the electrode 9 is formed by printing and burning a conductive paste containing silver and palladium, while the coating layer is formed by a glass or a resin material.

The distance P2 between the flat planes 8A, 8A opposed to each other is determined 0.3 mm, in the present embodiment. The connecting portion between the flat plane 8A and the bottom 8B is configured by a curved surface having a curvature of 0.1 mm or greater. That is, where forming rectangular holes through a green sheet, it is usually recommended that their corners be provided with about 0.08 mm radius for holes to avoid occurrence of cracks in the corner of the hole during burning. However, with such a curvature there possibly arises a problem that cracks are induced due to loading suffered during barrel electroplating or electrical measurement during the manufacturing process. As a result, the electrode of the complete component has discontinuity due to cracking occurred therein. Under such situations, it has been found by trial and error that such a fracture or cracking in the corner is almost completely eliminated by increasing the curvature in the corner greater than 0.1 mm. In this manner, by providing a curvature of 0.1 mm or greater to the corner, it is possible to significantly reduce the possibility of the occurrence of cracking in the corner and fracture of the projecting portion 9. Experiments conducted by the inventor indicates that such a structure significantly reduces breakage or fracture in network components during measurement or transportation thereof.

Meanwhile, the recessed portion 8 is configured by the opposite flat-planes 8A, 8A and the flat-plane bottom 8B continuous therewith so that the along-surface distance between the adjacent electrodes 9, 9 is large. For example, even if the pitch of a circuit pattern of a circuit board on which the chip network resistor is to be mounted is as small as 0.5 mm or finer, the distance between the base portions of the adjacent electrodes 9, 9 is secured sufficiently. This reduces the possibility of a short-circuit occurring during the processes of solder reflow or electroplating.

In the present embodiment, the width P1 of the electrode 9, as shown in FIG. 1, is determined 0.5 mm that is greater than the plane-to-plane distance P2. By thus increasing the width for the electrode, i.e., P1>P2, it is possible to reduce the influence by breakage due to cracks.

Then, a method of manufacturing a chip network electronic component will be explained. First a green sheet is formed from a viscous sludgy material mixed with an alumina powder, a binder material, and a solvent. The sludgy material is spread, for example, over a roll of a spreader by the doctor blade technique into an unburned ceramic sheet form while being adjusted in layer thickness. The unburned sheet is allowed to stand for drying into a green sheet.

Figure 4:
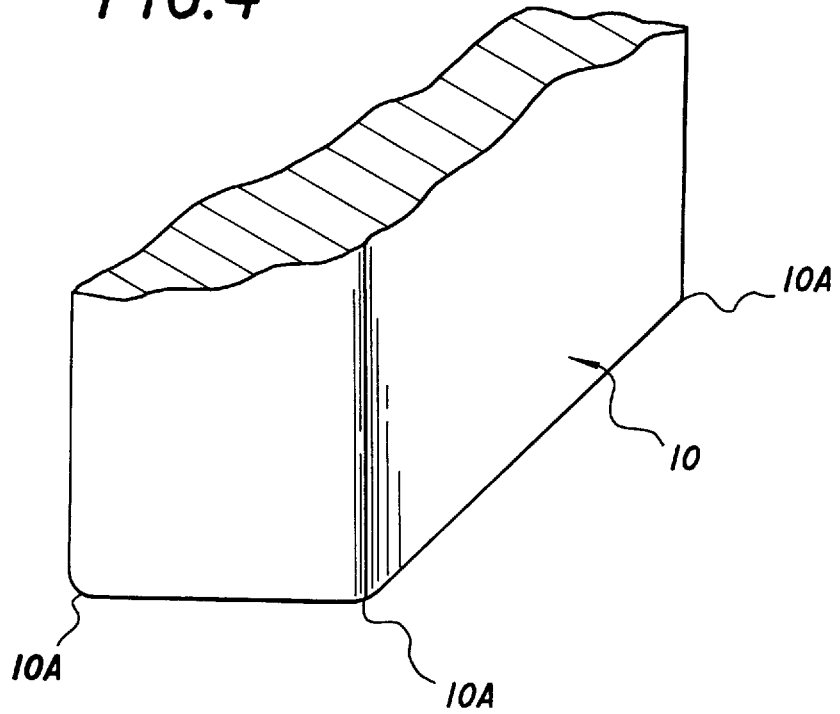
FIG. 4 is a perspective view of a metal die for blanking a green sheet.
Figure 9:
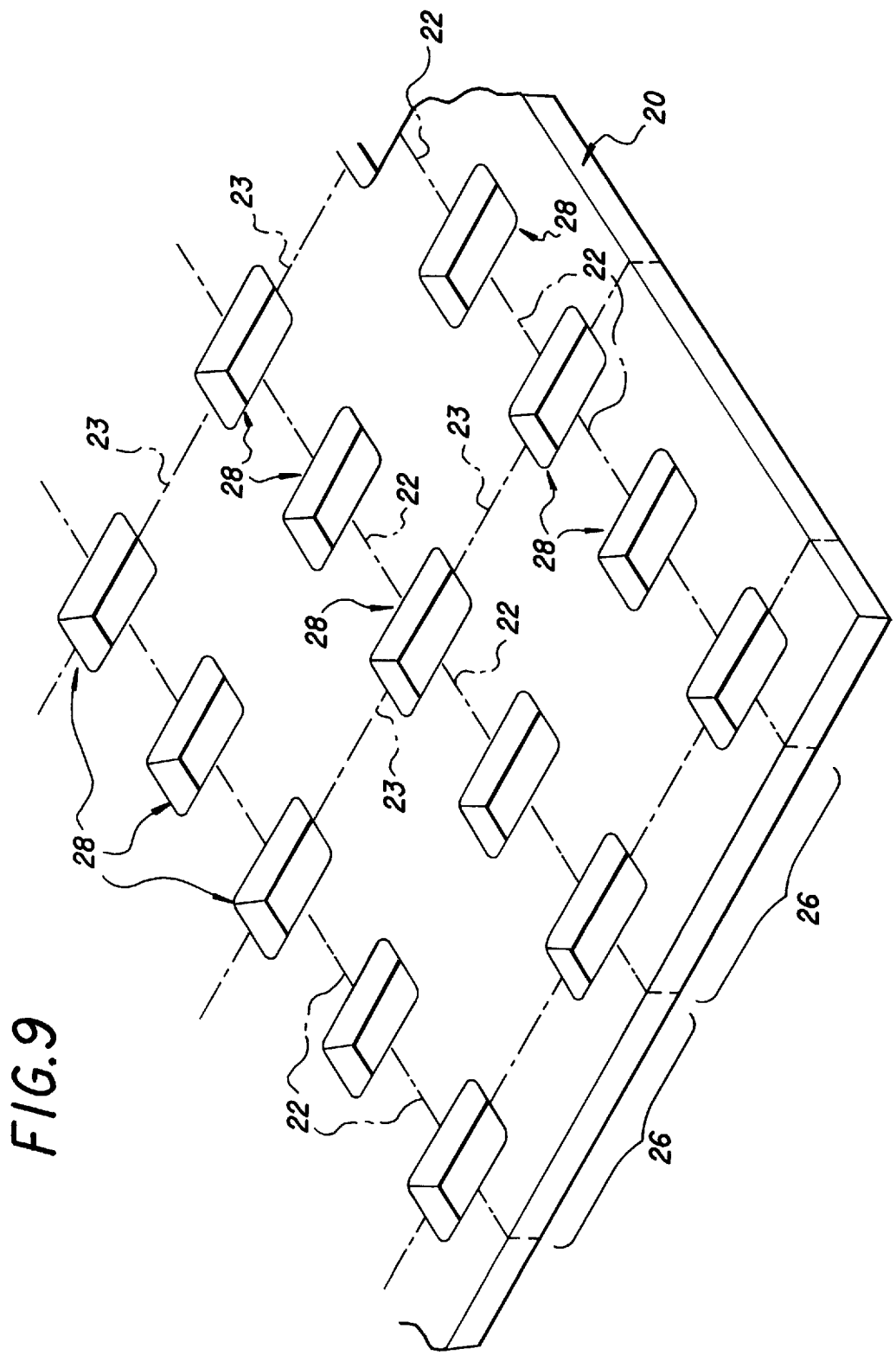
FIG. 9 is a partial perspective view of a green sheet to be divided into individual chip network resistor substrates.

In FIG. 9, reference character 20 is an alumina green sheet for forming an ceramic insulator substrate. In the green sheet 20, slit lines, i.e., longitudinal slit lines 22 and transverse slit lines 23, are formed in a grating manner at corresponding positions in upper and lower surfaces thereof so that the substrate 20 is easily broken into individual rectangular chips in a later process. At the intersections of these slit lines 22, 23 and at the intermediate points between the intersections on the lengthwise slit line 22, rectangular holes 28 are formed through the, green sheet 20. These rectangular holes are formed in the unburned green sheet by the use of a metal die 10 having four corners with a curvature of 0.1 mm or greater as shown in FIG. 4. Each rectangular hole 28 has four corners configured by a curved plane with a radius of 0.1 mm or greater, which corners are provided by transferring the metal die corners 10A during blanking the rectangular holes 28.

After forming the slits 22, 23 and the rectangular holes 28, the green sheet 20 is burnt at a temperature of approximately 700° C. into a ceramic substrate 20.

On the surface of the substrate 20 thus burnt, a surface electrode layer 9A, a resistance layer 2 based on ruthenium oxide in electrical connection to the surface electrode layer 9A, and a coating layer 3 covering the resistance layer 2 and part of the surface electrode layer 9A are formed in order through printing, evaporation, burning, etc. Thereafter, the substrate is broken along the longitudinal slits 22 into a plurality of bar-formed substrate 26. The bar substrate 26 is printed at opposite side surface with side electrodes 9B, and then broken at the transverse slits 23 into individual chip network resistors. By thus printing, the side electrode 9B is provided to extend to the surface of part of flat planes 8A, 8A as shown in FIG. 1 by reference 0. The divided chip network resistance is completed by being plated at electrode surfaces with Ni and solder.

Another embodiment 1

Figure 5:
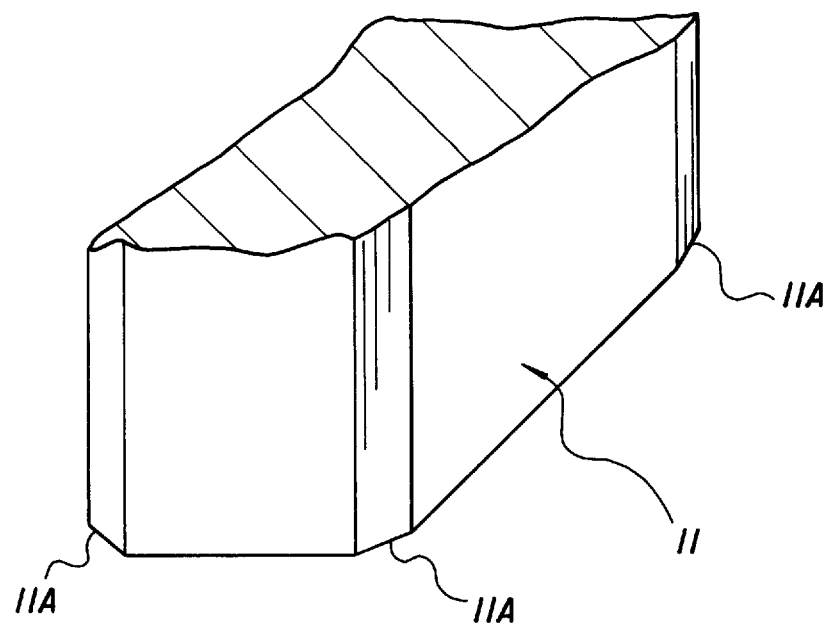
FIG. 5 is a modification of the metal die of FIG. 4.
Figure 6:
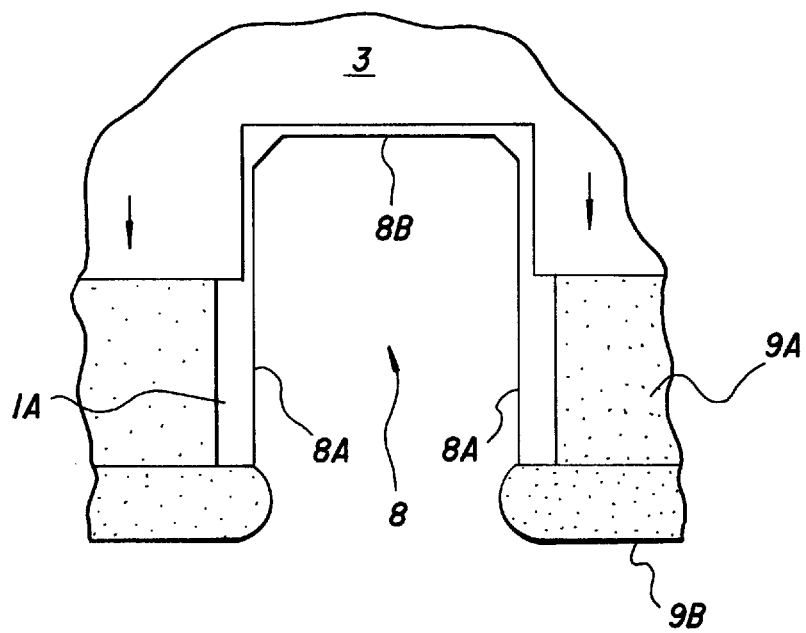
FIG. 6 is an enlarged fragmentary view showing a recessed portion blanked by the metal die of FIG. 5.

Another embodiment of the invention will now be explained wherein the corner provided between the flat-plane portion 8A and the bottom portion 8B is different in shape from the above embodiment. In this embodiment, a metal die 11 having surfaces chamfered 0.1 mm or greater at four corners shown in FIG. 5 is used in place of the metal die of FIG. 4. Consequently the flat plane 8A and the bottom 8B have a connecting portion formed therebetween to have one flat plane. FIG. 6 illustrates a expanded fragmentary view of a recessed portion 8 formed through the use of the metal die 11.

In this embodiment 1, a coating layer is formed extending to cover the surface of a base of the projecting portion 1A in a manner partially encompassing the surface electrode layer 9A, as shown by the arrows in FIG. 6. By covering the base of the projecting portion with the coating layer 3, the projecting portion at its base is increased in strength as compared with a structure without such a coating, effectively reducing the possibility of breakage in the projecting portion and hence the electrode 9. Although in this embodiment 1 a small gap is provided between the coating layer 3 and the recessed portion 8, if the bottom portion 8B or part of the flat-plane portion 8A is coated by the coating layer 3, the abovestated effect is further expected.

Another embodiment 2

Figure 7:
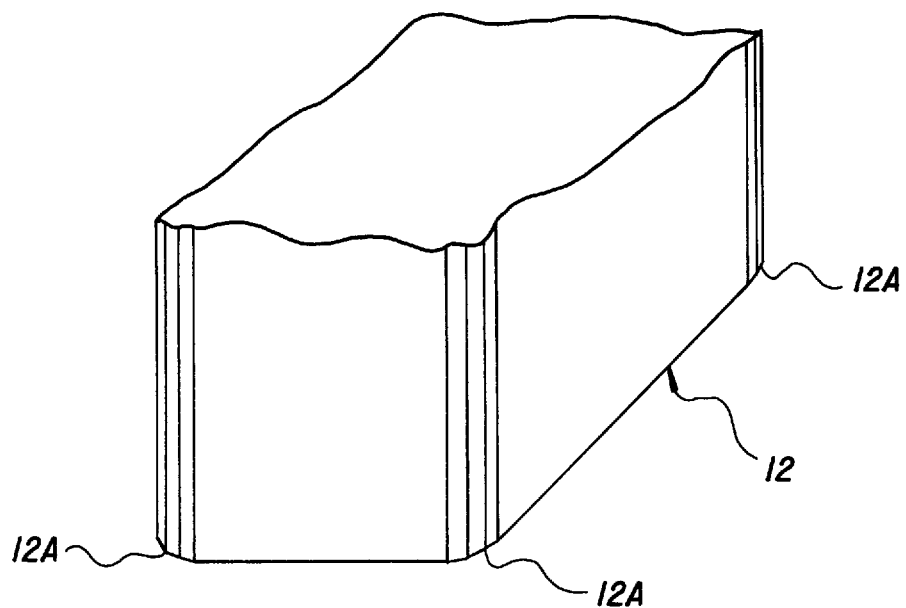
FIG. 7 is another modification of the metal die of FIG. 4.
Figure 8:
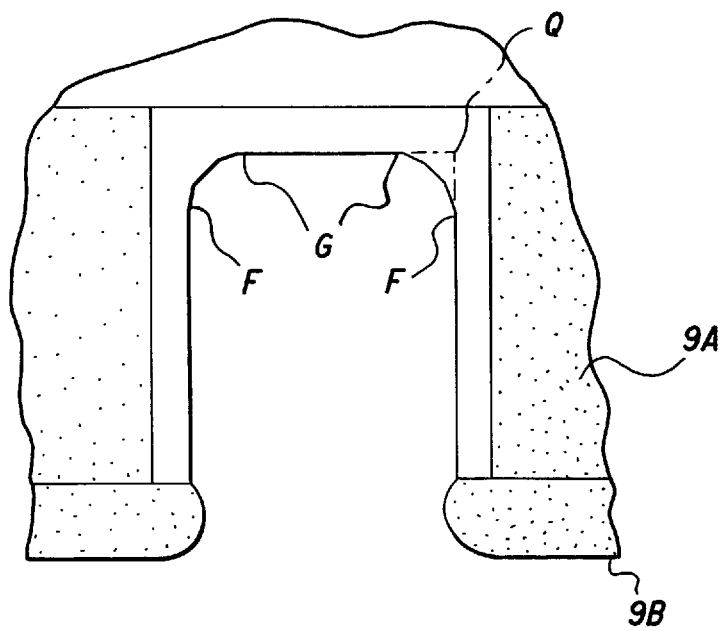
FIG. 8 is an enlarged fragmentary view showing a recessed portion blanked by the metal die of FIG. 7.

FIG. 7 shows a perspective view of a metal die 12 of a another embodiment 2. The metal die has corners 12A each chamfered by three surfaces. Consequently the flat plane 8A and the bottom 8B have a connecting portion formed therebetween to have three flat planes. As shown in FIG. 8, the corner has one outer chamfer point F and the other outer chamfer point G, wherein the extension from the point F and the extension from the point G have an intersection Q thereof. The corner is structured such that the distance between the outer chamfer point F and the intersection Q as well as between the outer chamfer point G and the intersection Q is determined greater than 0.1 mm.

As shown by the embodiments 1 and 2, by forming the corner between the flat plane 8A and the bottom 8B in a polygonal form with an angle greater than 90 degrees, the problem such as fracture due to cracking in the electrode 9 can be reduced. If the polygonal shape has an angle smaller than 90 degrees, there would be an increased possibility of microcracks occurring in the corner to an extent equivalent to or worse than the conventional structure.

As shown in the above embodiments 1 and 2, it has been found by the present inventors that the occurrence of microcracks is reduced similarly to the formation with a curvature greater than 0.1 mm by providing the corner 1A, 12A of the metal die 11, 12 with a polygonal shape.

Another embodiment 3

Figure 10:
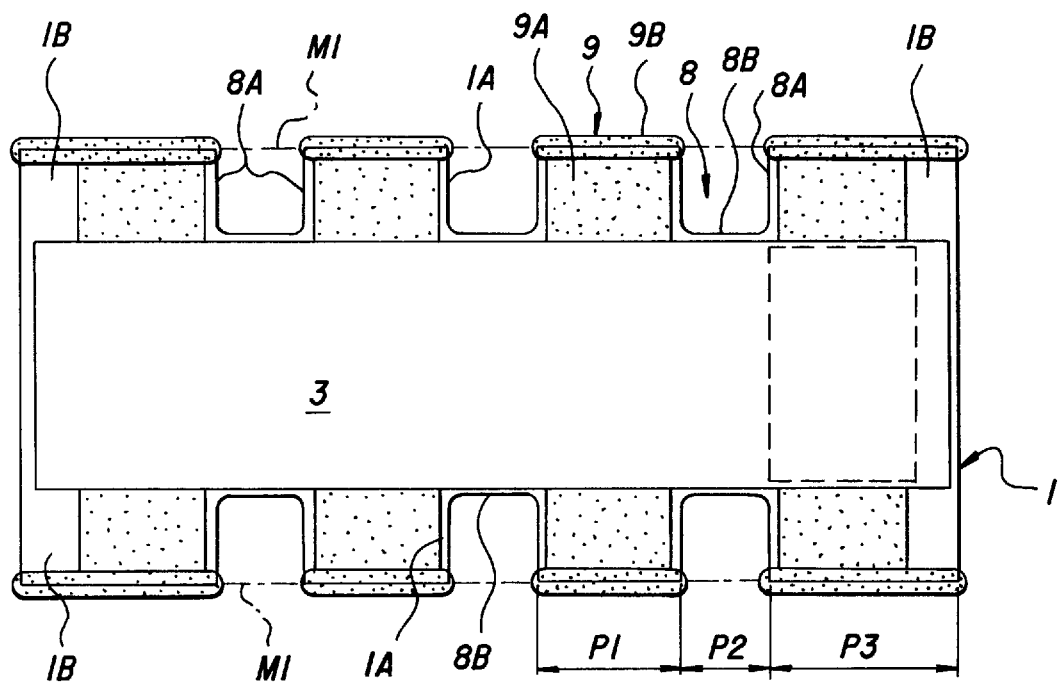
FIG. 10 is a plan view of a chip network resistor according to another embodiment 3 corresponding to FIG. 1.
Figure 11:
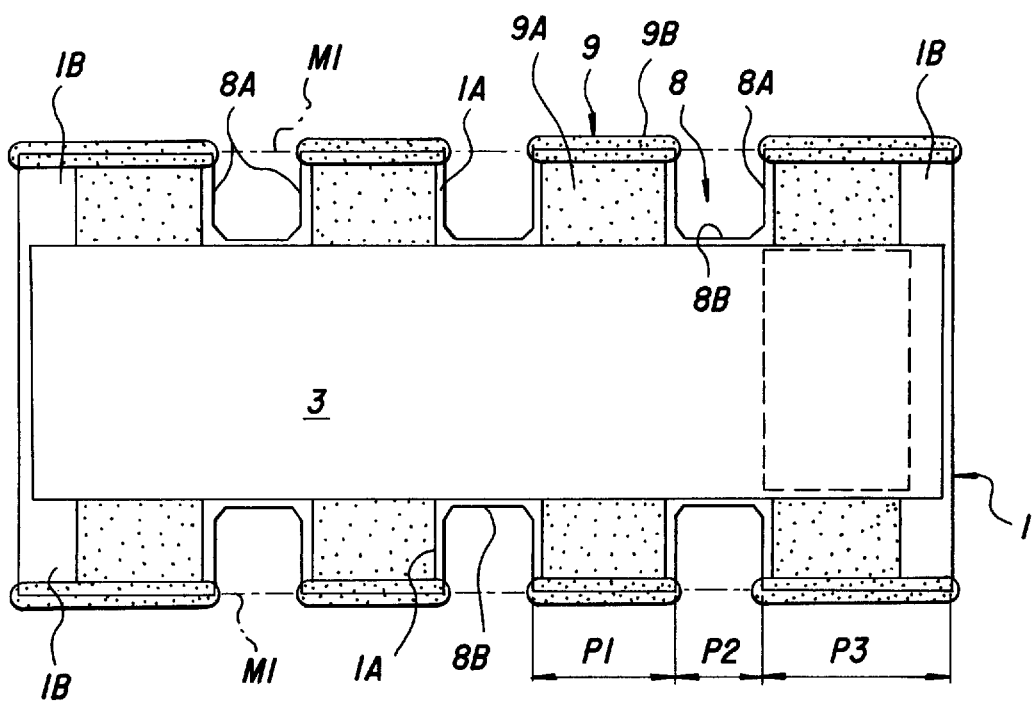
FIG. 11 is a plan view of a chip network resistor according to another embodiment 3 corresponding to FIG. 6.
Figure 12:
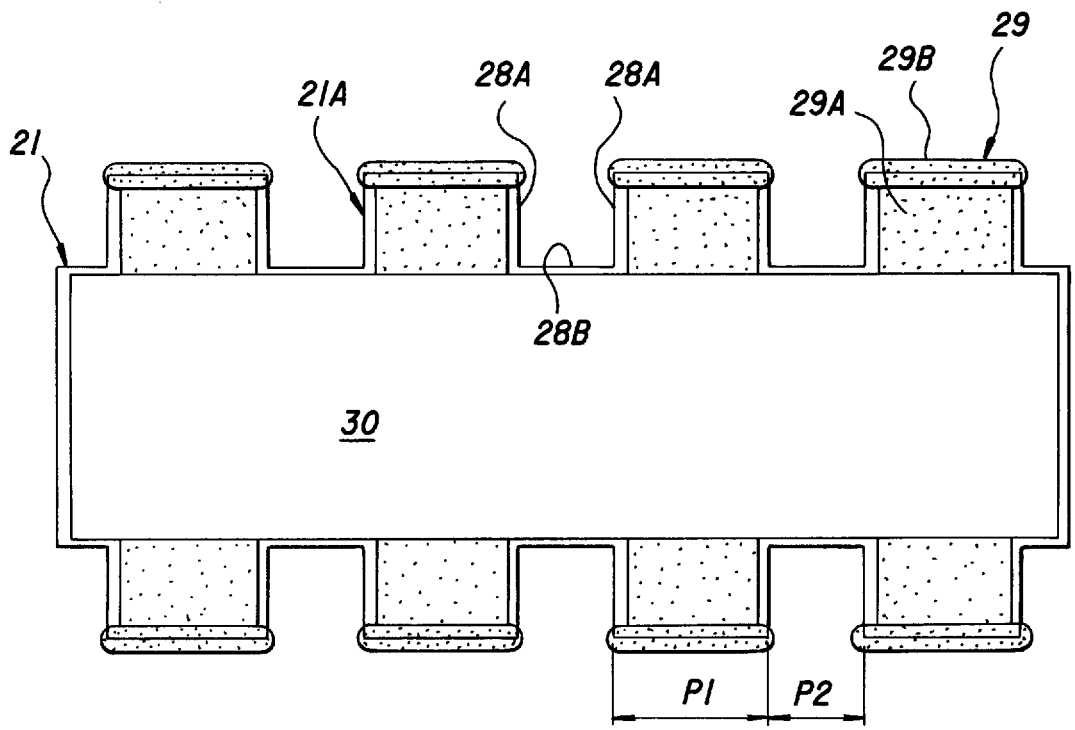
FIG. 12 is a plan view of a conventional chip network resistor.
Figure 13:
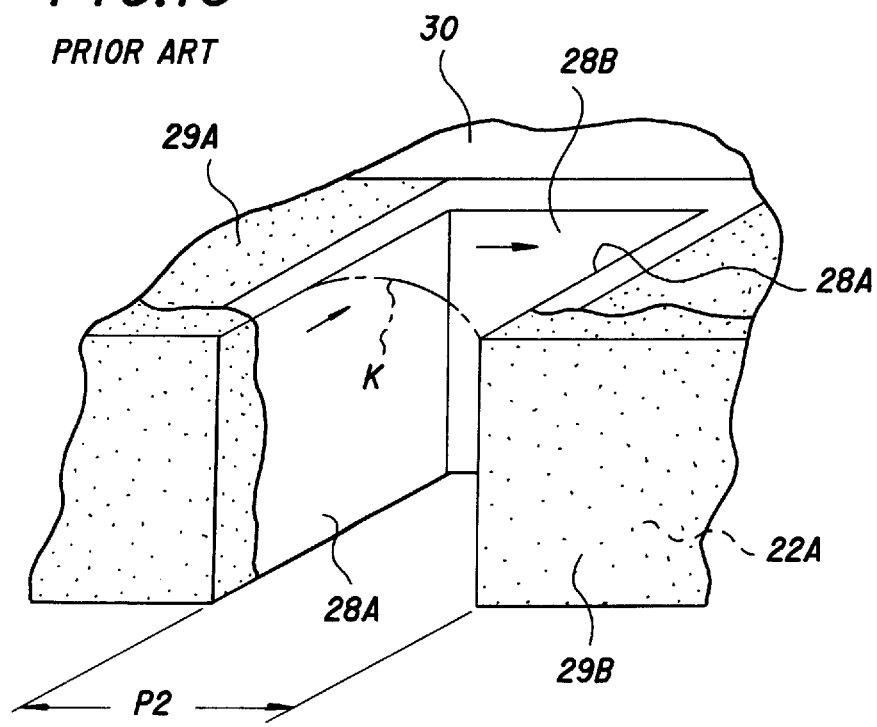
FIG. 13 is an enlarged perspective view of a recessed portion.
Figure 14:
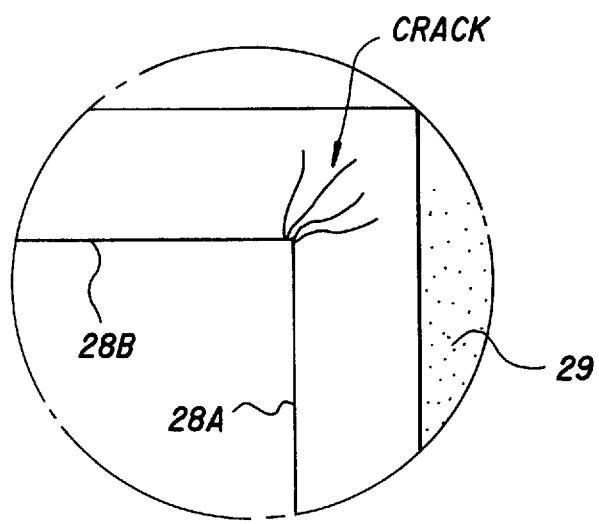
FIG. 14 is an illustrative view for explaining a conventional problem.
Figure 15:
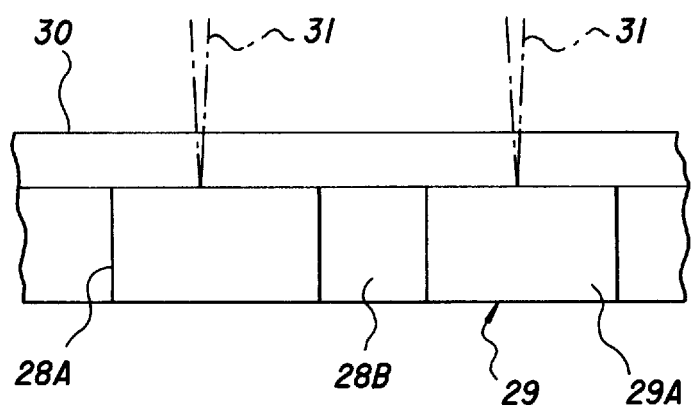
FIG. 15 is an illustrative view for explaining a conventional problem.

FIGS. 10 and 11 show another embodiment of the invention. In this embodiment 3, the chip network resistor has four projecting portions 1B that are positioned as right and left four projections as viewed in the figure to have a width P3 extending up to an associated longitudinal end of the substrate 1. That is, these four projecting portions 1B has a rectangular corner at an intersection of outer side surfaces. If so constructed, the width P3 of the projecting portion 1B has increased mechanical strength against external forces to be applied during a manufacture process, transportation, etc. This is because at these four corners there are practical no short circuit problems that have conventionally been encountered between the adjacent electrodes. In addition, the rectangular corner well serves for recognition of position or directionality of a chip substrate being treated under a manufacture processing.

Although preferred embodiments have been described in some detail, it is to be understood that certain changes can be made by those skilled in the art without departing from the spirit and scope of the invention as defined by the appended claims.

What is claimed is:

1. A chip network electronic component comprising:
an insulator substrate having recessed portions on opposite side surfaces forming a plurality of pairs of projecting portions;
electrodes formed respectively on each of said projecting portions and extending from a main surface to a back surface of said insulator substrate;
a plurality of electrical elements, each electrical element formed on said main surface of said substrate and electrically connected between an associated pair of said electrodes;
a coating layer covering a surface of said plurality of electrical elements; and wherein each of said recessed portions comprises a pair of opposite flat planes and a flat-planed bottom connecting said pair of opposite flat planes, said pair of opposite flat planes and said bottom has a connecting portion formed therebetween with a curvature of 0.1 mm or greater.

2. A chip network electronic component according to claim 1, wherein said opposite flat planes are spaced at a distance of 0.5 mm or smaller.

3. A chip network electronic component according to claim 2, wherein each of said projecting portion has a width greater than a distance between said pair of opposite flat planes.

4. A chip network electronic component according to claim 1, wherein said coating layer extends to the surface of at least part of said projecting portion.

5. A chip network electronic component according to claim 1, wherein said coating layer extends to the surface of at least part of one of said flat plane and said bottom of said recessed portion.

6. A chip network electronic component comprising:

an insulator substrate having recessed portions on opposite side surfaces forming a plurality of pairs of projecting portions;

electrodes formed respectively on each of said projecting portions and extending from a main surface to a back surface of said insulator substrate;

a plurality of electrical elements, each electrical element formed on said main surface of said substrate and electrically connected between an associated pair of said electrodes;

a coating layer covering a surface of said plurality of electrical elements; and wherein each of said recessed portions comprises a pair of opposite flat planes and a flat-planed bottom connecting said pair of opposite flat planes, said pair of opposite flat planes and said bottom having a connecting portion comprising at least one flat plane.

7. A chip network electronic component according to claim 6, wherein said opposite flat planes are spaced at a distance of 0.5 mm or smaller.

8. A chip network electronic component according to claim 7, wherein each of said projecting portion has a width greater than a distance between said pair of opposite flat planes.

9. A chip network electronic component according to claim 6, wherein said coating layer extends to the surface of at least part of said projecting portion.

10. A chip network electronic component according to claim 6, wherein said coating layer extends to the surface of at least part of one of said flat plane and said bottom of said recessed portion.

* * * * *